US012615835B2

(12) United States Patent
Song et al.

(10) Patent No.: US 12,615,835 B2
(45) Date of Patent: Apr. 28, 2026

(54) SEMICONDUCTOR DEVICE AND METHOD FOR MANUFACTURING THE SAME

(71) Applicant: DYNAX SEMICONDUCTOR, INC., Kunshan (CN)

(72) Inventors: Xi Song, Kunshan (CN); Pengyu Han, Kunshan (CN); Huiqin Wang, Kunshan (CN)

(73) Assignee: DYNAX SEMICONDUCTOR, INC., Kunshan (CN)

( * ) Notice: Subject to any disclaimer, the term of this patent is extended or adjusted under 35 U.S.C. 154(b) by 383 days.

(21) Appl. No.: 18/270,447

(22) PCT Filed: Dec. 21, 2021

(86) PCT No.: PCT/CN2021/140113
§ 371 (c)(1),
(2) Date: Jun. 29, 2023

(87) PCT Pub. No.: WO2022/143304
PCT Pub. Date: Jul. 7, 2022

(65) Prior Publication Data

US 2024/0072141 A1      Feb. 29, 2024

(30) Foreign Application Priority Data

Dec. 29, 2020    (CN) .......................... 202011599595.9

(51) Int. Cl.
*H01L 29/423*        (2006.01)
*H10D 64/00*        (2025.01)
(Continued)

(52) U.S. Cl.
CPC ......... *H10D 64/411* (2025.01); *H10D 64/111* (2025.01); *H10D 64/258* (2025.01); *H10D 30/015* (2025.01); *H10D 30/475* (2025.01)

(58) Field of Classification Search
CPC .. H10D 64/411; H10D 64/111; H10D 64/258; H10D 30/015; H10D 30/475; H10D 62/8503; H10D 30/47
See application file for complete search history.

(56) References Cited

U.S. PATENT DOCUMENTS

2006/0097294 A1    5/2006  Yamashita et al.
2006/0113533 A1*  6/2006  Tamaki ................ H10D 89/105
                                        257/E23.015

FOREIGN PATENT DOCUMENTS

CN        102782857  A    11/2012
CN        109768083  A    5/2019
CN        113451396  A    9/2021

OTHER PUBLICATIONS

PCT International Search Report and Written Opinion, Application No. PCT/CN2021/140113, dated Mar. 4, 2022, 12 pages: with English translation.

* cited by examiner

*Primary Examiner* — Mohammed R Alam
(74) *Attorney, Agent, or Firm* — Armstrong Teasdale LLP

(57)            ABSTRACT

Embodiments of the present disclosure disclose a semiconductor device and a method for manufacturing the same. The semiconductor device includes an active region and a passive region, the semiconductor device further includes a source, a gate and a drain located on one side of a substrate, the gate being located between the source and the drain, the gate includes a first end portion and an intermediate portion, the intermediate portion, the source and the drain all being located in the active region, and the first end portion being located in the passive region, the first end portion includes a first sub end portion and a second sub end portion. In a first direction, an extension width of the first sub end portion is greater than that of the intermediate portion, and an exten- (Continued)

sion width of the second sub end portion is greater than that of the first sub end portion.

13 Claims, 5 Drawing Sheets

(51) Int. Cl.
|  |  |
|---|---|
| *H10D 64/23* | (2025.01) |
| *H10D 64/27* | (2025.01) |
| *H10D 30/01* | (2025.01) |
| *H10D 30/47* | (2025.01) |

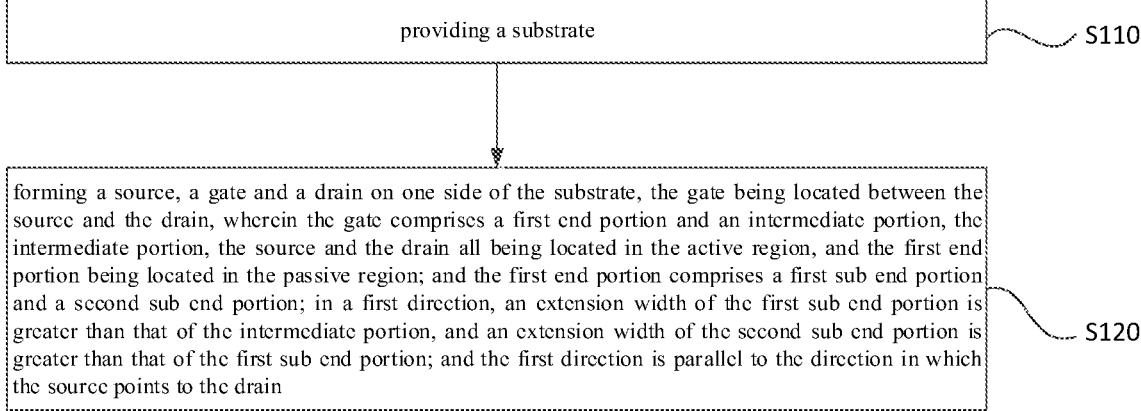

providing a substrate      S110 forming a source, a gate and a drain on one side of the substrate, the gate being located between the source and the drain, wherein the gate comprises a first end portion and an intermediate portion, the intermediate portion, the source and the drain all being located in the active region, and the first end portion being located in the passive region; and the first end portion comprises a first sub end portion and a second sub end portion; in a first direction, an extension width of the first sub end portion is greater than that of the intermediate portion, and an extension width of the second sub end portion is greater than that of the first sub end portion; and the first direction is parallel to the direction in which the source points to the drain      S120

Fig. 9

SEMICONDUCTOR DEVICE AND METHOD FOR MANUFACTURING THE SAME

CROSS REFERENCE TO RELATED APPLICATIONS

This patent application is a National Stage Entry of PCT/CN2021/140113 filed on Dec. 21, 2021, which claims the benefit and priority of Chinese Patent Application No. 202011599595.9 filed on Dec. 29, 2020, the disclosures of which are incorporated by reference herein in their entirety as part of the present application.

BACKGROUND

Embodiments of the present disclosure relate to the field of semiconductor technologies, and particularly to a semiconductor device and a method for manufacturing the same.

Since the semiconductor material Gallium Nitride (GaN) has a strong spontaneous and piezoelectric polarization effect, and has characteristics such as great forbidden band width, high electron mobility, high breakdown field strength, and good thermal conductivity etc., and has a strong spontaneous and piezoelectric polarization effect, it has obvious advantages in the application field of manufacturing high frequency, high voltage, and high temperature resistant high power electronic devices.

At present, 5G communication has high requirements on the bandwidth and operating frequency of semiconductor devices, and the structural design and manufacturing process of gates are closely related to the frequency characteristics of semiconductor devices. The structure of gates directly affects the operating frequency of semiconductor devices. In the manufacturing process of semiconductor devices, it is of significant importance to study the design of the gate.

Therefore, it has become an urgent problem how to further improve the reliability of semiconductor gates so that they can be used for large-scale commercial production while achieving stable performance of semiconductor devices.

BRIEF DESCRIPTION

In view of this, embodiments of the present disclosure provide a semiconductor device and a method for manufacturing the same, to further improve the reliability of the semiconductor gate, realize stable performance of the semiconductor device, and meet the requirements of large-scale commercial production and manufacture.

In a first aspect, an embodiment of the present disclosure provides a semiconductor device, including an active region and a passive region surrounding the active region. The semiconductor device further includes a substrate, and a source, a gate and a drain located on one side of the substrate, the gate being located between the source and the drain, wherein the gate includes a first end portion and an intermediate portion, the intermediate portion, the source and the drain all being located in the active region, and the first end portion being located in the passive region, and the first end portion includes a first sub end portion and a second sub end portion, in a first direction, an extension width of the first sub end portion is greater than that of the intermediate portion, and an extension width of the second sub end portion is greater than that of the first sub end portion, and the first direction is parallel to the direction in which the source points to the drain.

The first sub end portion may be bent toward one side of the source and/or one side of the drain, and the second sub end portion may be bent toward one side of the source and/or one side of the drain.

A distance between a bending endpoint of the first sub end portion and a boundary of the active region is $W_1$, where 2 $\mu m \leq W_1 \leq 10$ $\mu m$, and a distance between a bending endpoint of the second sub end portion and the boundary of the active region is $W_2$, where 10 $\mu m \leq W_2 \leq 50$ $\mu m$.

An edge outline of the first sub end portion close to at least one side of the source and/or the drain may include a first curve, where centers of arcs corresponding to any two points on the first curve are on the same side of the first curve, and an edge outline of the second sub end portion close to at least one side of the source and/or the drain may include a second curve, where centers of arcs corresponding to any two points on the second curve are on the same side of the second curve.

The first curve may include a first point and a second point, where the second point is located on one side of the first point close to the passive region, and a curvature radius corresponding to the second point is greater than a curvature radius corresponding to the first point.

The edge outline of the first sub end portion close to at least one side of the source and/or the drain may further include a third curve smoothly connected to the first curve, and the third curve is located on one side of the first curve close to the passive region, and centers of arcs corresponding to any two points on the first curve and any two points on the third curve are respectively located on different sides of the edge outline.

The first curve may include a first curve start point and a first curve end point, the second curve may include a second curve start point and a second curve end point, and the third curve may include a third curve start point and a third curve end point. The first curve end point coincides with the third curve start point, when bending directions of the first sub end portion and the second sub end portion are the same, the third curve end point coincides with the second curve start point, and when bending directions of the first sub end portion and the second sub end portion are different, extension direction of a line connecting the third curve end point and the second curve start point is parallel to the first direction, and the first curve start point is a connection point between the intermediate portion and the first sub end portion, and the second curve start point is a connection point between the first sub end portion and the second sub end portion.

The gate may further include a second end portion. In a second direction, the first end portion, the intermediate portion, and the second end portion are arranged in sequence, and the second end portion is located in the passive region, and the second direction is perpendicular to the first direction, and the second end portion may include a third sub end portion. In the first direction, an extension width of the third sub end portion is greater than that of the intermediate portion.

The second end portion may further include a fourth sub end portion which is located on one side of the third sub end portion away from the active region, and the fourth sub end portion is connected and in contact with the third sub end portion, and in the first direction, an extension width of the fourth sub end portion is greater than that of the third sub end portion.

In the first direction, the extension width of the first sub end portion is $L_1$, the extension width of the second sub end portion is $L_2$, the extension width of the third sub end portion is $L_3$, the extension width of the fourth sub end portion is $L_4$, and the extension width of the intermediate portion is D, where $1.2*D \leq L_1 \leq 30*D$;

$2.4*D \leq L_2 \leq 60*D$;

$1.2*D \leq L_3 \leq 30*D$; and $2.4*D \leq L_4 \leq 60*D$.

In a second aspect, an embodiment of the present disclosure provides a method of manufacturing the semiconductor device provided in the first aspect, including providing a substrate, and forming a source, a gate and a drain on one side of the substrate, the gate being located between the source and the drain, wherein the gate includes a first end portion and an intermediate portion, the intermediate portion, the source and the drain all being located in the active region, and the first end portion being located in the passive region, and the first end portion includes a first sub end portion and a second sub end portion, in a first direction, an extension width of the first sub end portion is greater than that of the intermediate portion, and an extension width of the second sub end portion is greater than that of the first sub end portion, and the first direction is parallel to the direction in which the source points to the drain.

In the semiconductor device provided by the embodiment of the present disclosure, a gate is arranged to include a first end portion and an intermediate portion in sequence, the intermediate portion, source, and drain are all ranged to be located in an active region, and the first end portion is located in a passive region, it is further arranged that the first end portion located in the passive region includes a first sub end portion and a second sub end portion, where the first sub end portion has a greater extension width in the direction in which the source points to the drain than the extension width of the intermediate portion in the same direction, and the second sub end portion has a greater extension width in the direction in which the source points to the drain than the extension width of the first end portion in the same direction. This structural design facilitates the infiltration of a developing solution from the first sub end portion to the intermediate portion, significantly reducing the difficulty of developing and correcting gate shape distortion at the corner positions corresponding to two ends of the source and drain due to light diffraction, and ensures that the gate shape at the corner positions corresponding to two ends of the source and drain is the same as or only slightly different from that of the intermediate portion, meanwhile, this further increases the contact area between the gate end metal and substrate, enhances adhesion between the gate metal and substrate, which may prevent local detachment of the gate metal during preparation and testing, and reduce the gate metal contact resistance, and increases the gate end portion area to facilitate interconnection between gate metals of the device, thereby improving device packaging efficiency. Such a gate structural design may ensure the stability and performance of the gate structure, further enhancing the operational stability and reliability of the semiconductor device, and may be used in fields such as radio frequency and power electronics.

BRIEF DESCRIPTION OF THE DRAWINGS

FIG. 9 is a schematic flow diagram of a method of manufacturing a semiconductor device provided by an embodiment of the present disclosure.

DETAILED DESCRIPTION

Hereinafter, the present disclosure is further described in detail in conjunction with the accompanying drawings and the embodiments. It may be appreciated that the specific embodiments described herein are merely used to explain the present disclosure, but not used to limit the present disclosure. Furthermore, it should be noted that only the components related to the present disclosure instead of all components, are shown in the accompanying drawings, for ease of description.

Figure 1:
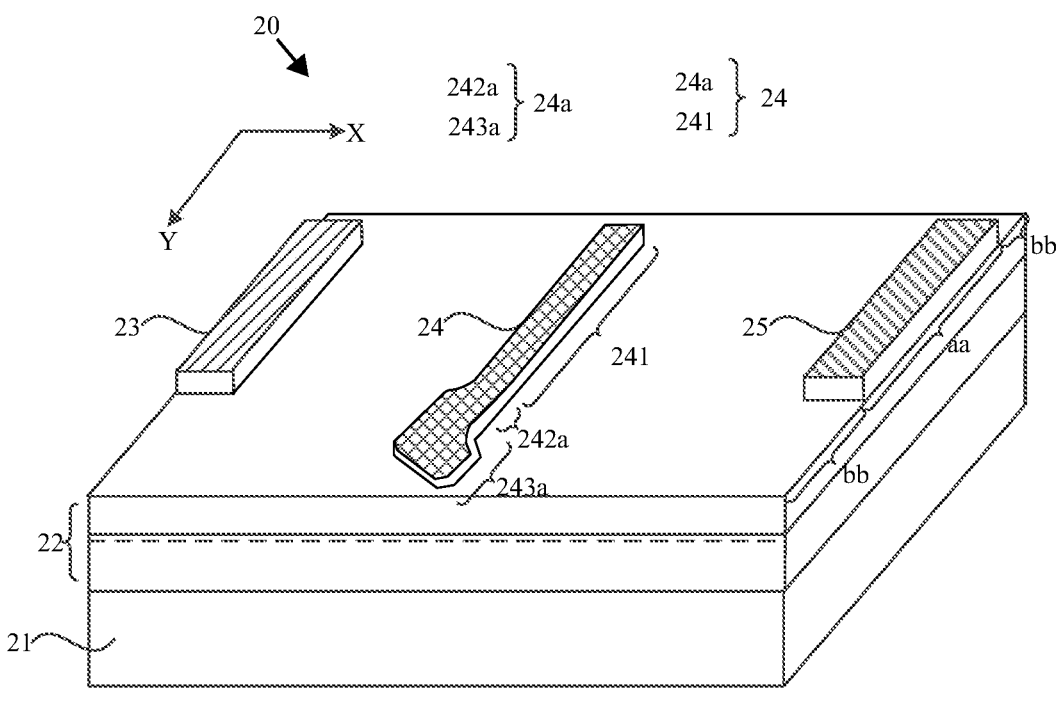
FIG. 1 is a structure schematic diagram of a semiconductor device provided by an embodiment of the present disclosure.
Figure 2:
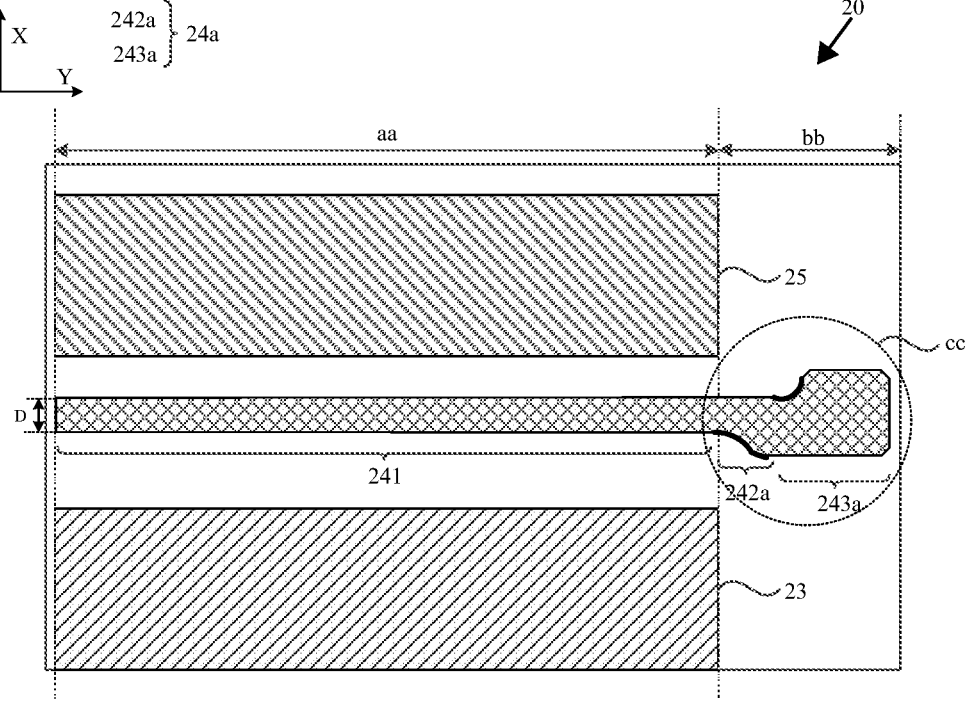
FIG. 2 is a top view structure schematic diagram of a semiconductor device provided by an embodiment of the present disclosure.

An embodiment of the present disclosure provides a semiconductor device, which can be used in the fields of radio frequency microwave, power electronics, and the like. FIG. 1 is a structure schematic diagram of a semiconductor device provided by an embodiment of the present disclosure, and FIG. 2 is a top view structure schematic diagram of a semiconductor device provided by an embodiment of the present disclosure. As shown in FIGS. 1 and 2, a semiconductor device 20 includes an active region aa and a passive region bb surrounding the active region aa. The semiconductor device 20 further includes a substrate 21, a source 23, a gate 24, and a drain 25 located on one side of the substrate 21, the gate 24 being located between the source 23 and the drain 25, wherein the gate 24 includes a first end portion 24a and an intermediate portion 241, the intermediate portion 241, the source 23, and the drain 25 all being located in the active region aa, and the first end portion 24a being located in the passive region bb, and the first end portion 24a includes a first sub end portion 242a and a second sub end portion 243a. In a first direction (X direction as shown), an extension width of the first sub end portion 242a is greater than that of the intermediate portion 241, and an extension width of the second sub end portion 243a is greater than that of the first sub end portion 242a, and the first direction is parallel to the direction in which the source 23 points to the drain 25.

Exemplarily, as shown in FIGS. 1 and 2, the source 23, the gate 24, and the drain 25 are arranged in a first direction (X direction as shown), and extend in the Y direction as shown, and the gate 24 is located between the source 23 and the drain 25, wherein the X direction as shown is parallel to the direction in which the source 23 points to the drain 25, and the Y direction is perpendicular to the X direction. The semiconductor device 20 includes an active region aa and a passive region bb surrounding the active region aa. The gate 24 sequentially includes a first end portion 24a and an intermediate portion 241, the intermediate portion 241, the source 23, and the drain 25 are located in the active region aa, and the first end portion 24*a* is located in the passive region bb, wherein the first end portion 24*a* includes a first sub end portion 242*a* and a second sub end portion 243*a*, both of which are located in the passive region bb, where the active region aa has two-dimensional electron gas, electrons or holes, which is the active working region of the semiconductor chip. The passive region bb refers to the region outside the active region that participates in the work of the device, but the working state is not affected by external circuits.

As shown in FIGS. 1 and 2, it is arranged that an extension width of the first sub end portion 242*a* located in the passive region bb in the X direction as shown is greater than that of the intermediate portion 241 in the X direction as shown, so that the first sub end portion 242*a* with a greater extension width is conducive to the infiltration of the developer from the first sub end portion 242*a* to the intermediate portion 241, reducing the difficulty of photolithographic development of the gate 24, which may correct the gate shape distortion at the corner positions corresponding to two ends of the source and drain due to light diffraction, significantly reduce the difficulty of development, ensure that the gate shape at the corner positions corresponding to two ends of the source and drain is the same as or only slightly different from that of the intermediate portion 241, ensure the stability of the structure and performance of the gate 24, further prevent the power and frequency of the semiconductor device from being affected by the gate shape distortion, and ensure the stable performance of the semiconductor device.

Further, as shown in FIGS. 1 and 2, it is arranged that the extension width of the second sub end portion 243*a* located in the passive region bb in the X direction as shown is greater than the extension width of the first sub end portion 242*a* in the X direction as shown, and is further greater than the extension width of the intermediate portion 241 in the X direction as shown; such a structural design increases the adhesion between the gate metal and the substrate by increasing the extension width of the gate end and increasing the contact area between the gate end metal and the substrate, which may prevent local detachment of the gate metal during preparation and testing, and reduce the gate metal contact resistance; meanwhile, the increased gate end area facilitates interconnection between device gate metals, improves device packaging efficiency, and further improves semiconductor device performance stability.

The material of substrate base 21 may be formed by one or more materials of silicon, sapphire, silicon carbide, gallium arsenide, gallium nitride, diamond, etc. It may also be other materials suitable for growing gallium nitride.

In summary, in the semiconductor device provided by the embodiment of the present disclosure, a gate is arranged to include a first end portion and an intermediate portion in sequence, the intermediate portion, source, and drain are all ranged to be located in an active region, and the first end portion is located in a passive region. It is further arranged that the first end portion located in the passive region includes a first sub end portion and a second sub end portion, where the first sub end portion has a greater extension width in the direction in which the source points to the drain than the extension width of the intermediate portion in the same direction, and the second sub end portion has a greater extension width in the direction in which the source points to the drain than the extension width of the first end portion in the same direction. This structural design facilitates the infiltration of a developing solution from the first sub end portion to the intermediate portion, significantly reducing the difficulty of developing and correcting gate shape distortion at the corner positions corresponding to two ends of the source and drain due to light diffraction, and ensures that the gate shape at the corner positions corresponding to two ends of the source and drain is the same as or only slightly different from that of the intermediate portion, meanwhile, this further increases the contact area between the gate end metal and substrate, enhances adhesion between the gate metal and substrate, which may prevent local detachment of the gate metal during preparation and testing, and it may reduce the gate metal contact resistance, meanwhile, due to the arrangement of the second sub end portion, the area of the gate end is further increased, which facilitates interconnection between gate metals of the device, thereby improving device packaging efficiency. Such a gate structural design may ensure the stability and performance of the gate structure, further enhancing the operational stability and reliability of the semiconductor device, and may be used in fields such as radio frequency and power electronics.

Continuing referring to FIGS. 1 and 2, the first sub end portion 242*a* is bent toward one side of the source 23 and/or one side of the drain 25, and the second sub end portion 243*a* is bent toward one side of the source 23 and/or one side of the drain 25.

Exemplarily, continuing referring to FIGS. 1 and 2, regarding the first sub end portion 242*a* and the second sub end portion 243*a* extending to the passive region bb, the first sub end portion 242 may extend and bend toward the source 23 in the Y direction as shown, or extend and bend toward the drain 25 (not shown), and may further extend and bend toward the source 23 and the drain 25 at the same time (not shown). The second sub end portion 243*a* connected to the first sub end portion 242*a* may extend and bend toward the source 23 (not shown), or extend and bend toward the drain 25, and it may further extend and bend toward the source 23 and the drain 25 at the same time (not shown). The embodiment of the present disclosure does not limit how the first sub end portion 242*a* and the second sub end portion 243*a* increase the width extending to the passive region, as long as it is ensured that at least the extension widths of the first sub end portion 242*a* and the second sub end portion 243*a* located in the passive region bb are greater than the extension width of the intermediate portion 241, and the extension width of the second sub end portion 243*a* is greater than the extension width of the first sub end portion 242*a*, so that the corresponding gate at the corners at two ends of the source and drain may be corrected, and the contact area between the gate end metal and the substrate may be increased.

When the extension width of the second sub portion 243*a* is greater than that of the first sub portion 242*a*, may be when the bending directions of the first sub portion 242*a* and the second sub portion 243*a* are opposite, it is beneficial to improve the degree of integration. Specifically, as shown in FIG. 1 and FIG. 2, when the first sub end portion 242*a* is bent toward one side of the source 23, the second sub end portion 243*a* is bent toward one side of the drain 25.

Figure 3:
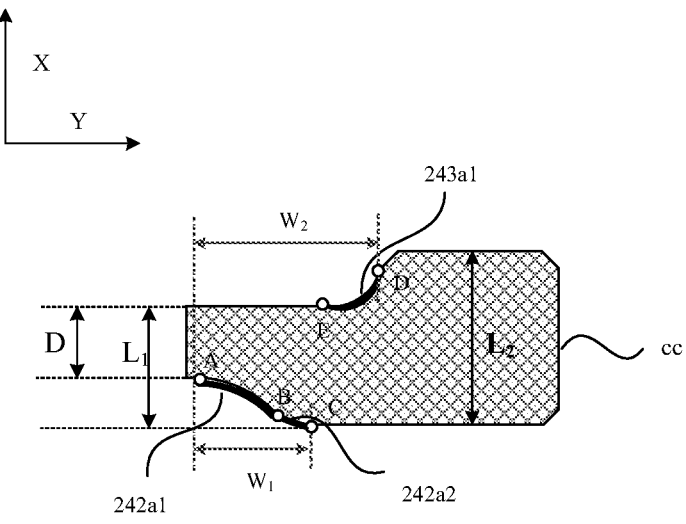
FIG. 3 is an enlarged structure schematic diagram of the cc region in FIG. 2.

FIG. 3 is an enlarged structure schematic diagram of the cc region in FIG. 2. FIG. 3 is only illustrated by taking the first end portion 24*a* in the passive region bb including first sub end portion 242*a* and the second sub end portion 243*a* as an example. As shown in FIGS. 2 and 3, a distance between a bending endpoint C of the first sub end portion 242*a* and a boundary of the active region aa is $W_1$, where $2$ $\mu m \leq W_1 \leq 10$ $\mu m$, and a distance between a bending endpoint D of the second sub end portion 243*a* and the boundary of the active region aa is $W_2$, where $10$ $\mu m \leq W_2 \leq 50$ $\mu m$.

Exemplarily, as shown in FIGS. 2 and 3, it is arranged that the distance $W_1$ between a bending endpoint C of the first sub end portion 242a and a boundary of the active region aa satisfies 2 μm≤$W_1$≤10 μm, and the distance $W_1$ between the bending endpoint C of the first sub end portion 242a and the boundary of the active region aa is reasonably arranged, which may ensure that the first sub end portion 242a of the gate does not occupy too much substrate area, and at the same time does not increase the capacitance between the first sub end portion 242a of the gate and the active region aa, the source 23 or the drain 25.

Further, it is arranged that the distance $W_2$ between a bending endpoint D of the second sub end portion 243a and the boundary of the active region aa satisfies 10 μm≤$W_2$≤50 μm; 10 μm≤$W_2$≤50 μm, as shown in FIGS. 2 and 3, the bending endpoint D of the second sub end portion 243a is located on one side of the bending endpoint C of the first sub end portion 242a away from the intermediate portion 241, and the distance $W_2$ between the bending endpoint D of the second sub end portion 243a and the boundary of the active region aa is reasonably arranged, to control the distance between the second sub end portion 243a of the gate and the source 23 or drain 25 of the active region aa, thereby, on the one hand, controlling the capacitance between the second sub end portion 243a and the active region aa, source 23 or drain 25 to reduce the device power loss. On the other hand, preventing the second sub end portion 243a of the gate from occupying too much substrate area.

On the basis of the above-mentioned embodiment, as shown in FIGS. 2 and 3, an edge outline of the first sub end portion 242a close to at least one side of the source 23 and/or the drain 25 includes a first curve 242a1, where centers of arcs corresponding to any two points on the first curve 242a1 are on the same side of the first curve 242a1, and an edge outline of the second sub end portion 243a close to at least one side of the source 23 and/or the drain 25 includes a second curve 243a1, where centers of arcs corresponding to any two points on the second curve 243a1 are on the same side of the second curve 243a1.

Exemplarily, as shown in FIGS. 2 and 3, the first sub end portion 242a is bent toward one side of the source 23 and the edge outline of the first sub end portion 242a close to one side of the source 23 includes a first curve 242a1, and the second sub end portion 243a is bent toward one side of the drain 25 and the edge outline of the second sub end portion 243a close to one side of the drain 25 includes a second curve 243a1. As shown in FIG. 3, the centers of arcs corresponding to any two points on the first curve 242a1 are on the same side of the first curve 242a1, and such a structure may reduce the electric field peak between the gate and the source, and the centers of arcs corresponding to any two points on the second curve 243a1 are on the same side of the second curve 243a1, and such a structure may reduce the electric field peak between the gate and the drain, and further ensure the stable performance of the semiconductor device.

It should be noted that this embodiment only takes that the edge outline of the first sub end portion 242a close to the source 23 includes the first curve 242a1 and the edge outline of the second sub end portion 243a close to the drain 25 side includes the second curve 243a1 as an example. It may be appreciated that, the edge outline of the first sub end portion 242a close to the drain 25 may also be set to include the first curve 242a1, or it may also be set that the edge outlines of the first sub end portion 242a close to one side of the source 23 and close to one side of the drain 25 both include the first curve 242a1. Similarly, the edge outline of the second sub end portion 243a close to the source 23 may also be set to include the second curve 243a1, or it may also be set that the edge outlines of the second sub end portion 243a close to one side of the source 23 and close to one side of the drain 25 both include the second curve 243a1, which is not limited in this embodiment of the present disclosure.

Figure 4:
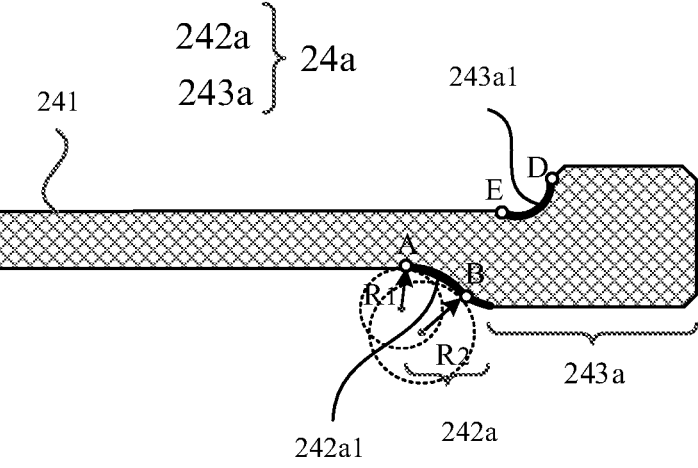
FIG. 4 is a local top view structure schematic diagram of a gate provided by an embodiment of the present disclosure.

FIG. 4 is a local top view structure schematic diagram of a gate provided by an embodiment of the present disclosure. As shown in FIG. 4, the first curve 242a1 includes a first point A and a second point B, where the second point B is located on one side of the first point A close to the passive region bb, and a curvature radius R2 corresponding to the second point B is greater than a curvature radius R1 corresponding to the first point A.

Exemplarily, FIG. 4 takes the first point as the first curve start point A and the second point as the first curve end point B as an example for illustration. As shown in FIG. 4, the first curve start point A is the boundary point between the active region aa and the passive region bb, and the curvature radius R2 corresponding to the second point B is greater than the curvature radius R1 corresponding to the first point A, so that, in the direction in which the active region aa points to the passive region bb, the distance between the first curve 242a1 and the opposite chamfer of the source 23 gradually increases, which further optimizes the electric field between the gate 24 and the source 23, further ensuring stable performance of the semiconductor device.

Figure 5:
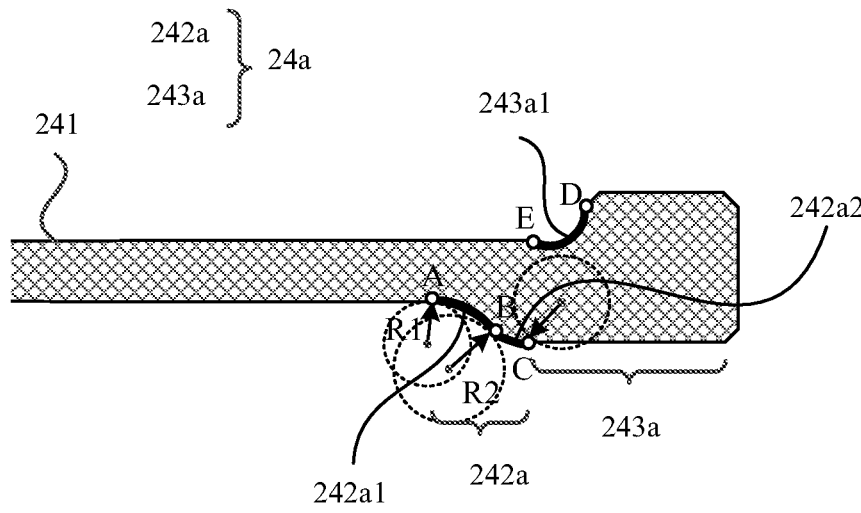
FIG. 5 is a local top view structure schematic diagram of another gate provided by an embodiment of the present disclosure.

FIG. 5 is a local top view structure schematic diagram of another gate provided by an embodiment of the present disclosure. As shown in FIG. 5, the edge outline of the first sub end portion 242a close to at least one side of the source 23 and/or the drain 25 further includes a third curve 242a2 smoothly connected to the first curve 242a1, and the third curve 242a2 is located on one side of the first curve 242a1 close to the passive region bb, and centers of arcs corresponding to any two points on the first curve 242a1 and any two points on the third curve 242a2 are respectively located on different sides of the edge outline.

Exemplarily, FIG. 5 only takes that the first end portion 24a located in the passive region bb includes a first sub end portion 242a and a second sub end portion 243a, where the first sub end portion 242a is bent toward one side of the source 23, and the edge outline of the first sub end portion 242a close to one side of the source 23 includes a first curve 242a1 and a third curve 242a2, and the second sub end portion 243a is bent toward one side of the drain 25, and the edge outline of the second sub end portion 243a close to one side of the drain 25 includes a second curve 243a1 as an example for illustration. As shown in FIG. 5, the third curve 242a2 is arranged to be located on one side of the first curve 242a1 close to the passive region bb, and the first curve 242a1 is smoothly connected to the third curve 242a2, so as to ensure that no electric field peaks will be generated on the second sub end portion 243a close to one side of the source 23 due to sharp corners, further improving the stability of the electrical performance of the semiconductor; meanwhile, this may further avoid stress concentration and ensure stable mechanical properties of the semiconductor device.

Further, it is arranged that centers of arcs corresponding to any two points on the first curve 242a1 and any two points on the third curve 242a2 are respectively located on different sides of the edge outline, to further ensure that the distance between the first curve 2341 and the opposite chamfer of the source 23 increases gradually, the electric field between the gate 24 and the source 23 is optimized, and the performance stability of the semiconductor device is improved.

It should be noted that this embodiment only takes that the edge outline of the first sub end portion 242a close to one side of the source 23 includes a first curve 242a1 and the third curve 242a2, and the edge outline of the second sub end portion 243a close to one side of the drain 25 includes a second curve 243a1 as an example. It may be appreciated that, it may also be arranged that the edge outline of the first sub end portion 242a close to one side of the drain 25 includes a first curve 242a1 and a third curve 242a2, or the edge outlines close to one side of the source 23 and close to one side of the drain 25 both include the first curve 242a1 and the third curve 242a2, which is not limited in this embodiment of the present disclosure.

Continuing referring to FIGS. 3 and 5, the first curve 242a1 includes a first curve start point A and a first curve end point B, the second curve 243a1 includes a second curve start point E and a second curve end point D, and the third curve 242a2 includes a third curve start point B and a third curve end point C. The first curve end point B coincides with the third curve start point B, when bending directions of the first sub end portion 242a and the second sub end portion 243a are the same, the third curve end point C coincides with the second curve start point E (not shown), and when bending directions of the first sub end portion 242a and the second sub end portion 243a are different, extension direc- tion of a line connecting the third curve end point C and the second curve start point E is parallel to the first direction (X direction as shown), and the first curve start point A is a connection point between the intermediate portion 241 and the first sub end portion 242a, the second curve start point E is a connection point between the first sub end portion 242a and the second sub end portion 243a, and the second curve start point E is located on one side of the first curve start point A away from the intermediate portion 241.

Exemplarily, as shown in FIG. 3, the end point of the first curve 242a1 coincides with the third curve start point, both of which are point B, and the start point A of the first curve 242a1 is the connection point between the intermediate portion 241 and the first sub end portion 242a. The start point E of the second curve 243a1 is set as the connection point between the first sub end portion 242a and the second sub end portion 243a, and the extension direction of the line between the third curve end point C and the second curve start point E is parallel to the first direction (X direction as shown), to distinguish the first sub end portion 242a from the second sub end portion 243a, and to further reasonably set the structure of the first sub end portion 242a and the second sub end portion 243a.

It should be noted that the embodiment of the present disclosure only takes that the bending directions of the first sub end portion 242a and the second sub end portion 243a are different as an example; when the bending directions of the first sub end portion 242a and the second sub end portion 243a are the same, the third curve end point C coincides with the second curve start point E, forming an edge outline like at least one side of the source 23 and/or the drain 25, which will not be described in detail here.

Figure 6:
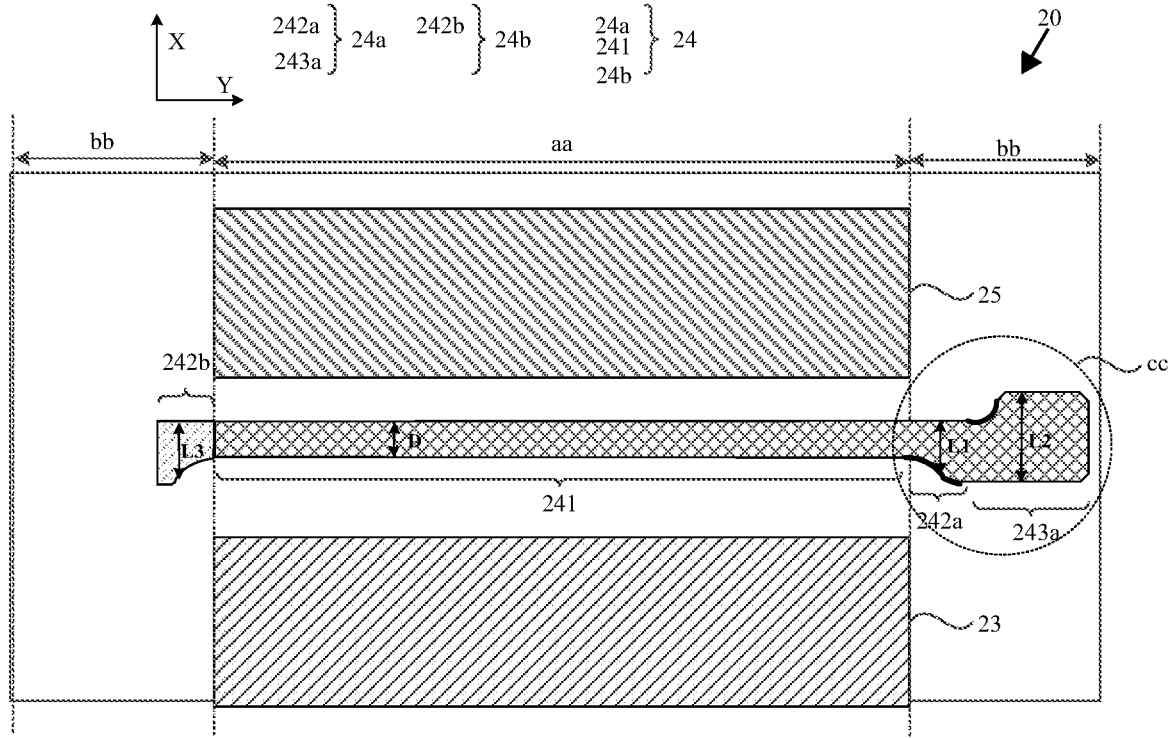
FIG. 6 is a structure schematic diagram of another semiconductor device provided by an embodiment of the present disclosure.

As a feasible implementation manner, FIG. 6 is a structure schematic diagram of another semiconductor device pro- vided by an embodiment of the present disclosure. As shown in FIG. 6, the gate 24 may further include a second end portion 24b. In a second direction (Y direction as shown), the first end portion 24a, the intermediate portion 241, and the second end portion 24b are arranged in sequence, and the second end portion 24b is located in the passive region bb, and the second direction is perpendicular to the first direc- tion (X direction as shown), and the second end portion 24b includes a third sub end portion 242b. In the first direction, an extension width of the third sub end portion 242b is greater than that of the intermediate portion 241.

Exemplarily, as shown in FIG. 6, in the Y direction as shown, the gate 24 includes a first end portion 24a, an intermediate portion 241 and a second end portion 24b arranged in sequence, where the first end portion 24a and the second end portion 24b are both located in the passive region bb. The second end portion 24b is arranged to include a third sub end portion 242b, and the extension width of the third sub end portion 242b in the X direction as shown is greater than that of the intermediate portion 241, wherein the shapes of the first end portion 24a and the second end portion 24b may be the same or different, which is not limited in this embodiment of the present disclosure. Further, the third sub end portion 242b may be bent toward one side of the source 23 and/or toward the drain 25, as shown in FIG. 6, the third sub end portion 242b is bent toward one side of the source 23. By arranging the second end portion 24b extending to the gate end of the passive region bb, the width of the corresponding gate at the corner positions of the two ends of the source and drain is adjusted, to correct the distortion of the gate shape corresponding to the corner position at two ends of the source and drain due to light diffraction, improve gate stability, and avoid affecting the power and frequency of semiconductor devices due to gate deformation; mean- while, since the first end portion 24a and the second end portion 24b are arranged at two ends of the gate to increase the contact area between the gate end metal and the sub- strate, and increase the adhesion between the gate metal and the substrate, it may prevent local detachment of the gate metal during preparation and testing, and reduce the gate metal contact resistance; meanwhile, the increased gate end area facilitates the interconnection between device gate metals, improves device packaging efficiency, and further improves the stability of the semiconductor device perfor- mance and improves the stability of the semiconductor device.

Figure 7:
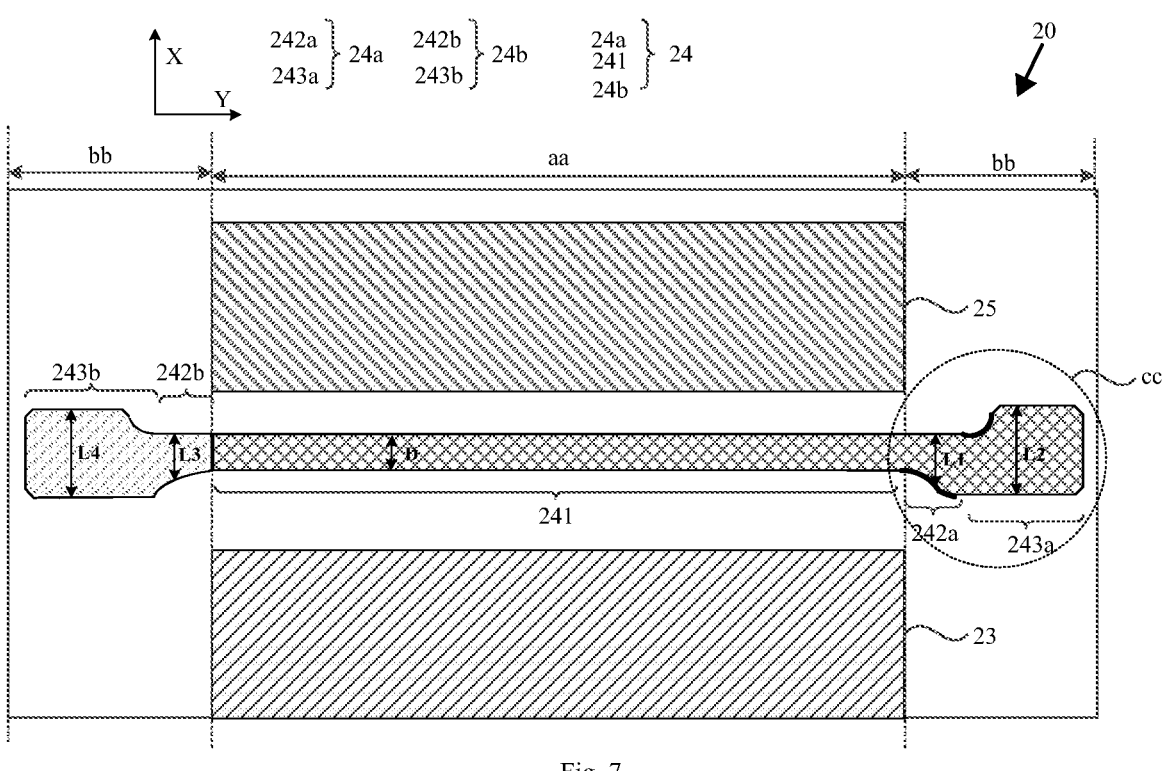
FIG. 7 is a structure schematic diagram of another semiconductor device provided by an embodiment of the present disclosure.

On the basis of the above embodiment, FIG. 7 is a structure schematic diagram of another semiconductor device provided by an embodiment of the present disclosure. As shown in FIG. 7, the second end portion 24b may further include a fourth sub end portion 243b which is located on one side of the third sub end portion away from the active region aa, and the fourth sub end portion 243b is connected and in contact with the third sub end portion 242b, and in the first direction (X direction as shown), an extension width of the fourth sub end portion 243b is greater than that of the third sub end portion 242b.

Exemplarily, as shown in FIG. 7, similar to the first end portion 24a provided in the above embodiment, the second end portion 24b includes a third sub end portion 242b and a fourth sub end portion 243b, and the extension width of the third sub end portion 242b in the X direction as shown is greater than that of the intermediate portion 241, and the extension width of the fourth sub end portion 243b in the X direction is greater than that of the third sub end portion 242b, wherein the shapes of the first end portion 24a and the second end portion 24b may be the same or different, which is not limited in this embodiment of the present disclosure. By further arranging the second sub end portion 24b to include a third sub end portion 242b and a fourth sub end portion 243b, and further setting the second end portion 24b extending to the gate end of the passive region bb, the width of the corresponding gate at the corner positions of the two ends of the source and drain is adjusted, to correct the distortion of the gate shape corresponding to the corner position at two ends of the source and drain due to light diffraction, improve gate stability, and avoid affecting the power and frequency of semiconductor devices due to gate deformation; meanwhile, since the first end portion 24a and the second end portion 24b are arranged at two ends of the gate to increase the contact area between the gate end metal and the substrate, and increase the adhesion between the gate metal and the substrate, it may prevent local detachment of the gate metal during preparation and testing, and reduce the gate metal contact resistance; meanwhile, the increased gate end area facilitates the interconnection between device gate metals, improves device packaging efficiency, and further improves the stability of the semiconductor device performance and improves the stability of the semiconductor device.

On the basis of the above embodiment, in conjunction with FIGS. 3, 6 and 7, in the first direction, the extension width of the first sub end portion 242a is $L_1$, the extension width of the second sub end portion 243a is $L_2$, the extension width of the third sub end portion 242b is $L_3$, the extension width of the fourth sub end portion 243b is $L_4$, and the extension width of the intermediate portion 241 is D, where $1.2*D \leq L_1 \leq 30*D$; $2.4*D \leq L_2 \leq 60*D$; $1.2*D \leq L_3 \leq 30*D$; and $2.4*D \leq L_4 \leq 60*D$.

Exemplarily, the gate 24 including a first end portion 24a and a second segment portion 24b is taken as an example for illustration. As shown in FIG. 7, the extension width $L_1$ of the first sub end portion 242a extending to the passive region bb is arranged to satisfy $1.2*D \leq L_1 \leq 30*D$, and it is arranged that the extension width of the third sub end portion 242b extending to the passive region bb satisfies $1.2*D \leq L_3 \leq 30*D$; reasonably arranging the extension widths of the first sub end portion 242a and the third sub end portion 242b extending to the passive region bb may ensure that the first sub end portion 242a extending to the passive region bb moderately corrects the corresponding gate 24 at the corners of both ends of the source and drain, to make up for or completely eliminate the problem of gate width reduction due to light diffraction; at the same time, this will not cause over-correction, and will not cause the problem of widening the width of the gate 24 corresponding to the corners of both ends of the source and drain due to over-correction, and ensures that the gate widths of the gates 24 located in the active region aa are consistent or substantially consistent.

Further, it is arranged that the extension width $L_2$ of the second sub end portion 243a extending to the passive region bb is greater than $L_1$, and the extension width D of the intermediate portion satisfies $2.4*D \leq L_2 \leq 60*D$, and it is arranged that the extension width $L_4$ of the fourth sub end portion 243b extending to the passive region bb is greater than $L_3$, and the extension width D of the intermediate portion satisfies $2.4*D \leq L_4 \leq 60*D$, which may ensure a larger contact area between the gate and the substrate, increase the adhesion between the gate metal and the substrate, and prevent the gate strip from falling off; meanwhile, it will not occupy too much substrate area or affect device integration efficiency; it can ensure strong adhesion between the gate 24 and the substrate, and further ensure the stable structure and performance of the semiconductor device.

Therein, $L_1$ may be equal to $1.2*D$, $1.5*D$, $2*D$, $3*D$, $3.5*D$, $5*D$, $10*D$, $15*D$ or $30*D$, and $L_2$ may be equal to $2.4*D$, $3*D$, $3.5*D$, $5*D$, $10*D$, $15*D$, $30*D$ or $60*D$ and $L_2 > L_1$. $L_3$ may be equal to $1.2*D$, $1.5*D$, $2*D$, $3*D$, $3.5*D$, $5*D$, $10*D$, $15*D$, or $30*D$, and $L_4$ may be equal to $2.4*D$, $3*D$, $3.5*D$, $5*D$, $10*D$, $15*D$, $30*D$, or $60*D$, and $L_4 > L_3$. The embodiment of the present disclosure does not enumerate the specific values, and the specific correspondence between the extension width of the first end portion 24a and the extension width of the second end portion 24b extending to the passive region bb is not limited, but only needs to meet the structural stability and performance stability of the gate 24 to further ensure the stable performance of the semiconductor device.

Figure 8:
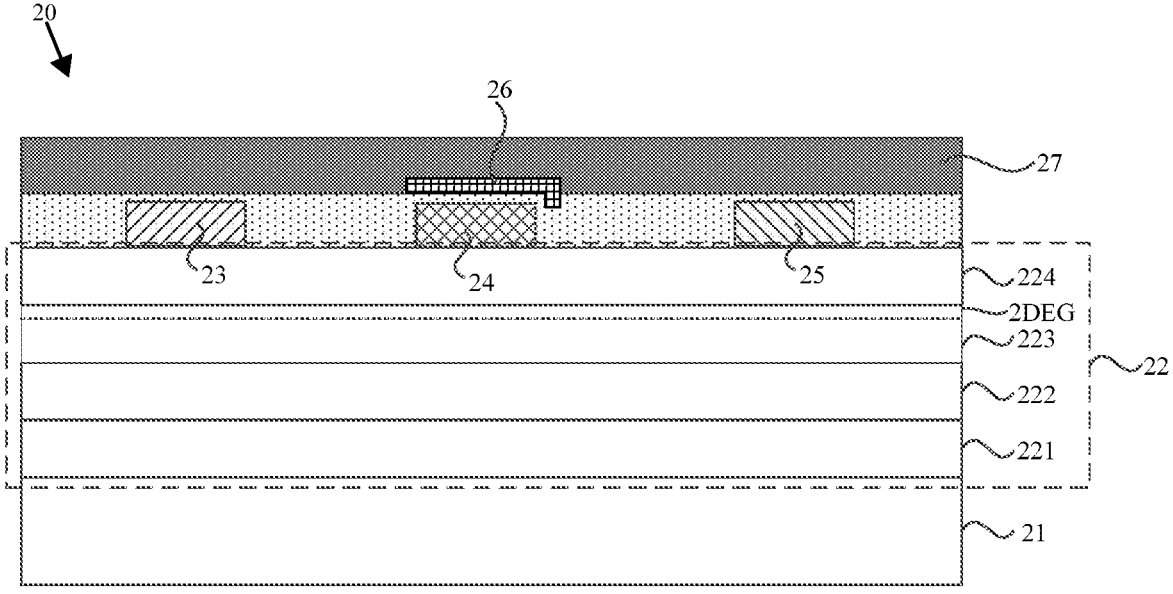
FIG. 8 is a cross-sectional structure schematic diagram of a semiconductor device provided by an embodiment of the present disclosure.

FIG. 8 is a cross-sectional structure schematic diagram of a semiconductor device provided by an embodiment of the present disclosure. As shown in FIG. 8, on the basis of the embodiments above, the semiconductor device 20 provided by the embodiments of the present disclosure further includes a field plate structure 26 located on one side of the gate 24 away from the substrate 21, and a plate capacitor is formed by the field plate structure 26 and the gate 24.

Exemplarily, since the extension width of the first end portion and/or the second end portion at least located in the passive region bb in the second direction is greater than the extension width of the intermediate portion in the second direction (as shown in FIG. 7), the overall area of the gate 24 is increased. Since the gate 24 and the field plate structure 26 above the gate 24 form a plate capacitor, the gate 24 serves as a capacitor substrate of the plate capacitor, and increasing the area of the gate 24 may increase the capacitance of the plate capacitor, which can increase the control range of the gate and source capacitance, and further optimize the performance of the semiconductor device.

Further, continuing referring to FIG. 8, the semiconductor device 20 provided by the embodiment of the present disclosure may further include a protective layer 27, which is located on one side of the field plate structure 26 away from the substrate 21 for encapsulating and protecting the semiconductor device 20.

Continuing referring to FIG. 8, the semiconductor device 20 provided by the embodiment of the present disclosure may further include a multilayer semiconductor layer 22 which may include a nucleation layer 221 on the substrate 10, a buffer layer 222 located on one side of the nucleation layer 221 away from the substrate 21, a channel layer 223 located on one side of the buffer layer 222 away from the nucleation layer 221, and a barrier layer 224 located on one side of the channel layer 223 away from the buffer layer 222, wherein a heterojunction structure is formed by the barrier layer 224 and the channel layer 223, and 2DEG is formed at the interface of the heterojunction.

Exemplarily, materials of the nucleation layer 221 and the buffer layer 222 may be nitrides, specifically GaN or AlN or other nitrides, and the nucleation layer 221 and the buffer layer 222 may be used to match the material of the substrate base 10 and the epitaxial channel layer 223. Material of the channel layer 223 may be GaN or other semiconductor materials, such as InAlN. The barrier layer 224 is located above the channel layer 223, material of the barrier layer 224 may be any semiconductor material capable of forming a heterojunction structure with the channel layer 223, including a gallium compound semiconductor material or a nitride semiconductor material.

The gallium nitride radio frequency device formed by using the semiconductor device structure of the present disclosure may improve the power and frequency of the gallium nitride radio frequency device on the premise of maintaining stable performance of the semiconductor device, and thus it is more suitable for the field of high-frequency 5G communication.

It should be appreciated that the embodiments of the present disclosure improve the output power of the semiconductor device from the perspective of the structure design of the semiconductor device. The semiconductor devices include but are not limited to high-power gallium nitride High Electron Mobility Transistor (referred to as HEMT) working in high voltage and high current environment, Silicon-On-Insulator (referred to as SOI) structure transistors, gallium arsenide (GaAs)-based transistors and Metal-Oxide-Semiconductor Field-Effect Transistor (referred to as MOSFET), Metal-Semiconductor Field-Effect Transistor (referred to as MISFET), Double Heterojunction Field-Effect Transistor (referred to as DHFET), Junction Field-Effect Transistor (referred to as JFET), Metal-Semiconductor Field-Effect Transistor (referred to as MESFET), Metal-Semiconductor Heterojunction Field-Effect Transistor (referred to as MISHFET) or other field effect transistors.

Based on the same inventive concept, embodiments of the present disclosure also provide a method of manufacturing a semiconductor device for manufacturing the semiconductor device provided by the embodiments above. FIG. 9 is a schematic flow diagram of a method of manufacturing a semiconductor device provided by an embodiment of the present disclosure. As shown in FIG. 9, the method of manufacturing a semiconductor device provided by the embodiment of the present disclosure includes:

S110, providing a substrate.

Exemplarily, material of the substrate may be Si, SiC, gallium nitride or sapphire, and may also be other materials suitable for growing gallium nitride. The method of forming the substrate may be atmospheric pressure chemical vapor deposition, sub-atmospheric pressure chemical vapor deposition, metal organic compound vapor deposition, low pressure chemical vapor deposition, high density plasma chemical vapor deposition, ultra high vacuum chemical vapor deposition, plasma enhanced chemical vapor deposition, catalyst chemical vapor deposition, hybrid physical chemical vapor deposition, rapid thermal chemical vapor deposition, vapor epitaxy, pulsed laser deposition, atomic layer epitaxy, molecular beam epitaxy, sputtering or evaporation.

S120, forming a source, a gate and a drain on one side of the substrate, the gate being located between the source and the drain, wherein the gate includes a first end portion and an intermediate portion, the intermediate portion, the source and the drain all being located in the active region, and the first end portion being located in the passive region, and the first end portion includes a first sub end portion and a second sub end portion. In a first direction, an extension width of the first sub end portion is greater than that of the intermediate portion, and an extension width of the second sub end portion is greater than that of the first sub end portion, and the first direction is parallel to the direction in which the source points to the drain.

Specifically, as shown in FIGS. 1 and 2, the source 23, the gate 24 and the drain 25 are formed so as to be arranged in a first direction (X direction as shown) and extend in the Y direction as shown, and the gate 24 is located between the source 23 and the drain 25, wherein the X direction as shown is parallel to the direction in which the source 23 points to the drain 25, and the Y direction is perpendicular to the X direction. The semiconductor device 20 includes an active region aa and a passive region bb surrounding the active region aa. The gate 24 sequentially includes a first end portion 24a and an intermediate portion 241, the intermediate portion 241, the source 23 and the drain 25 are located in the active region aa, and the first end portion 24a is located in the passive region bb, wherein the first end portion 24a includes a first sub end portion 242a and a second sub end portion 243a, both of which are located in the passive region bb, where the active region aa has two-dimensional electron gas, electrons or holes, which is the active working region of the semiconductor chip. The passive region bb refers to the region outside the active region that participates in the work of the device, but the working state is not affected by external circuits.

As shown in FIGS. 1 and 2, it is formed that an extension width of the first sub end portion 242a located in the passive region bb in the X direction as shown is greater than that of the intermediate portion 241 in the X direction as shown, so that the first sub end portion 242a with a greater extension width is conducive to the infiltration of the developer from the first sub end portion 242a to the intermediate portion 241, reducing the difficulty of photolithographic development of the gate 24, which may correct the gate shape distortion at the corner positions corresponding to two ends of the source and drain due to light diffraction, significantly reduce the difficulty of development, ensure that the gate shape at the corner positions corresponding to two ends of the source and drain is the same as or only slightly different from that of the intermediate portion 241, ensure the stability of the structure and performance of the gate 24, further prevent the power and frequency of the semiconductor device from being affected by the gate shape distortion, and ensure the stable performance of the semiconductor device.

Further, as shown in FIGS. 1 and 2, it is formed that the extension width of the second sub end portion 243a located in the passive region bb in the X direction as shown is greater than the extension width of the first sub end portion 242a in the X direction as shown, and is further greater than the extension width of the intermediate portion 241 in the X direction as shown; such a structural design increases the adhesion between the gate metal and the substrate by increasing the extension width of the gate end and increasing the contact area between the gate end metal and the substrate, which may prevent local detachment of the gate metal during preparation and testing, and reduce the gate metal contact resistance; meanwhile, the increased gate end area facilitates interconnection between device gate metals, improves device packaging efficiency, and further improves semiconductor device performance stability.

The semiconductor device provided in the embodiment of the present disclosure may further include a multi-layer semiconductor layer, and correspondingly, the manufacturing method further includes forming a multi-layer semiconductor layer on one side of the substrate. Specifically, the multi-layer semiconductor layer may be of a semiconductor material of III-V compound, and 2DEG is formed in the multi-layer semiconductor layer.

In summary, in the method of manufacturing a semiconductor device provided by the embodiment of the present disclosure, by forming the first end portion of the gate extending into a passive region, the first end portion located in the passive region includes a first sub end portion and a second sub end portion, where the first sub end portion and the second sub end portion located in the passive region have greater extension widths in the direction in which the source points to the drain than the extension width of the intermediate portion in the same direction, and the second sub end portion has a greater extension width than the extension width of the first end portion in the same direction. In this way, at least the first end portion located in the passive region has a greater extension width, and the first end portion of the gate with a greater extension width is conducive to the infiltration of a developing solution from the end portion to the intermediate portion, which may correct gate shape distortion at the corner positions corresponding to two ends of the source and drain due to light diffraction and significantly reduce the difficulty of developing, ensure that the gate shape at the corner positions corresponding to two ends of the source and drain is the same as or only slightly different from that of the intermediate portion, ensure the stability of the gate structure and performance, and further prevent the power and frequency of the semiconductor device from being affected by the deformation of the gate, and ensure the stable performance of the semiconductor device, which may be used in fields such as radio frequency and power electronics.

It is to be noted that the foregoing embodiments are merely example embodiments of the present disclosure and technical principles used thereby. Those skilled in the art may understand that the present disclosure is not limited to the specific embodiments described herein, and those skilled in the art may make various obvious changes, readjustments, and substitutions without departing from the protection scope of the present disclosure. Therefore, although reference is made to the present disclosure in more detail in the foregoing embodiments, the present disclosure is not merely limited to the foregoing embodiments, other more equivalent embodiments may be further included without departing from the conception of the present disclosure, and the scope of the present disclosure depends on the scope of the appended claims.

What is claimed is:

1. A semiconductor device comprising an active region and a passive region surrounding the active region, the semiconductor device further comprising:

a substrate; and a source, a gate, and a drain located on one side of the substrate, the gate located between the source and the drain;

wherein the gate comprises a first end portion and an intermediate portion, the intermediate portion, the source, and the drain all located in the active region, and the first end portion located in the passive region;

wherein the first end portion comprises a first sub end portion and a second sub end portion, wherein, in a first direction, an extension width of the first sub end portion is greater than that of the intermediate portion, wherein an extension width of the second sub end portion is greater than that of the first sub end portion, and wherein the first direction is parallel to the direction in which the source points to the drain;

wherein the first sub end portion is bent toward one side of the source and/or one side of the drain; and wherein the second sub end portion is bent toward one side of the source and/or one side of the drain.

2. The semiconductor device according to claim 1, wherein a distance between a bending endpoint of the first sub end portion and a boundary of the active region is $W_1$, and wherein 2 µm≤$W_1$≤10 µm; and wherein a distance between a bending endpoint of the second sub end portion and the boundary of the active region is $W_2$, and wherein 10 µm≤$W_2$≤50 µm.

3. The semiconductor device according to claim 1, wherein an edge outline of the first sub end portion close to at least one side of the source and/or the drain comprises a first curve, and wherein centers of arcs corresponding to any two points on the first curve are on the same side of the first curve; and wherein an edge outline of the second sub end portion close to at least one side of the source and/or the drain comprises a second curve, and wherein centers of arcs corresponding to any two points on the second curve are on the same side of the second curve.

4. The semiconductor device according to claim 3, wherein the first curve comprises a first point and a second point, and wherein the second point is located on one side of the first point close to the passive region; and wherein a curvature radius corresponding to the second point is greater than a curvature radius corresponding to the first point.

5. The semiconductor device according to claim 3, wherein the edge outline of the first sub end portion close to at least one side of the source and/or the drain further comprises a third curve smoothly connected to the first curve, and wherein the third curve is located on one side of the first curve close to the passive region; and wherein centers of arcs corresponding to any two points on the first curve and any two points on the third curve are respectively located on different sides of the edge outline.

6. The semiconductor device according to claim 5, wherein the first curve comprises a first curve start point and a first curve end point, wherein the second curve comprises a second curve start point and a second curve end point, and wherein the third curve comprises a third curve start point and a third curve end point;

wherein the first curve end point coincides with the third curve start point;

wherein, when bending directions of the first sub end portion and the second sub end portion are the same, the third curve end point coincides with the second curve start point; and wherein the first curve start point is a connection point between the intermediate portion and the first sub end portion, and wherein the second curve start point is a connection point between the first sub end portion and the second sub end portion.

7. The semiconductor device according to claim 1, wherein the gate further comprises a second end portion, wherein, in a second direction, the first end portion, the intermediate portion, and the second end portion are arranged in sequence, wherein the second end portion is located in the passive region, and wherein the second direction is perpendicular to the first direction; and wherein the second end portion comprises a third sub end portion, and wherein, in the first direction, an extension width of the third sub end portion is greater than that of the intermediate portion.

8. The semiconductor device according to claim 7, wherein the second end portion further comprises a fourth sub end portion which is located on one side of the third sub end portion opposite the active region, and wherein the fourth sub end portion is connected and in contact with the third sub end portion; and wherein, in the first direction, an extension width of the fourth sub end portion is greater than that of the third sub end portion.

9. The semiconductor device according to claim 8, wherein, in the first direction, the extension width of the first sub end portion is L1, wherein the extension width of the second sub end portion is L2, wherein the extension width of the third sub end portion is L3, wherein the extension width of the fourth sub end portion is L4, wherein the extension width of the intermediate portion is D, wherein 1.2*D≤$L_1$≤30*D;

wherein 2.4*D≤$L_2$≤60*D;

wherein 1.2*D≤$L_3$≤30*D; and wherein 2.4*D≤$L_4$≤60*D.

10. A method of manufacturing a semiconductor device according to claim 1, the method comprising:

providing a substrate; and forming a source, a gate, and a drain on one side of the substrate, the gate located between the source and the drain;

wherein, the gate comprises a first end portion and an intermediate portion, the intermediate portion, the source, and the drain all located in the active region, and the first end portion located in the passive region;

wherein the first end portion comprises a first sub end portion and a second sub end portion, wherein, in a first direction, an extension width of the first sub end portion is greater than that of the intermediate portion, wherein an extension width of the second sub end portion is greater than that of the first sub end portion, and wherein the first direction is parallel to the direction in which the source points to the drain;

wherein the first sub end portion is bent toward one side of the source and/or one side of the drain; and

wherein the second sub end portion is bent toward one side of the source and/or one side of the drain.

11. The semiconductor device according to claim 1, wherein the bending endpoint of the second sub end portion is located on one side of the bending endpoint of the first sub end portion opposite the intermediate portion.

12. The semiconductor device according to claim 5, wherein the first curve comprises a first curve start point and a first curve end point, wherein the second curve comprises a second curve start point and a second curve end point, and wherein the second curve start point is located on one side of the first curve start point opposite the intermediate portion.

13. The semiconductor device according to claim 6, wherein, when bending directions of the first sub end portion and the second sub end portion are different, the extension direction of a line connecting the third curve end point and the second curve start point is parallel to the first direction.

* * * * *